(12) United States Patent
Lee et al.

(10) Patent No.: US 8,703,562 B2
(45) Date of Patent: Apr. 22, 2014

(54) MANUFACTURING METHOD OF RANDOM ACCESS MEMORY

(75) Inventors: Tzung-Han Lee, Taipei (TW); Chung-Lin Huang, Taoyuan County (TW); Ron-Fu Chu, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 84 days.

(21) Appl. No.: 13/426,832

(22) Filed: Mar. 22, 2012

(65) Prior Publication Data
US 2013/0203232 A1    Aug. 8, 2013

(30) Foreign Application Priority Data

Feb. 3, 2012 (TW) .............................. 101103500 A

(51) Int. Cl.
*H01L 21/8238* (2006.01)
(52) U.S. Cl.
USPC ........... 438/210; 438/128; 438/190; 438/239; 438/381
(58) Field of Classification Search
USPC ........... 257/300, E27.084, E27.098, E21.209, 257/E21.66, E27.088; 438/381, 128, 190, 438/210, 238, 239, FOR. 189, FOR. 220, 438/FOR. 430
See application file for complete search history.

(56) References Cited

U.S. PATENT DOCUMENTS

| 4,873,664 | A | * | 10/1989 | Eaton, Jr. ...................... 365/145 |
| 6,373,743 | B1 | * | 4/2002 | Chen et al. ..................... 365/145 |
| 7,122,851 | B2 | * | 10/2006 | Itokawa et al. ................ 257/295 |
| 2003/0151941 | A1 | * | 8/2003 | Salling ........................... 365/145 |
| 2006/0009046 | A1 | * | 1/2006 | Yamamoto et al. ............ 438/791 |
| 2006/0024884 | A1 | * | 2/2006 | Kim et al. ...................... 438/253 |
| 2007/0170486 | A1 | * | 7/2007 | Park ............................... 257/306 |
| 2007/0182017 | A1 | * | 8/2007 | Park ............................... 257/774 |
| 2009/0179246 | A1 | * | 7/2009 | Nakamura et al. ............. 257/298 |
| 2010/0327407 | A1 | * | 12/2010 | Kang .............................. 257/532 |
| 2011/0117718 | A1 | * | 5/2011 | Nakamura et al. ............. 438/387 |
| 2012/0037970 | A1 | * | 2/2012 | Park et al. ...................... 257/296 |
| 2012/0091520 | A1 | * | 4/2012 | Nakamura ..................... 257/303 |

\* cited by examiner

*Primary Examiner* — Alexander Sofocleous
*Assistant Examiner* — Joannie A Garcia
(74) *Attorney, Agent, or Firm* — Rosenberg, Klein & Lee

(57) ABSTRACT

A manufacturing method of a random access memory includes the following steps: providing a semiconductor structure having an array region and a peripheral region; forming a plurality of first trenches in the array region, and concurrently, a plurality of second trenches on the peripheral region; forming a polysilicon layer to cover the array region and the peripheral region, and the first and the second trenches are filled up with the polysilicon layer; planarizing the polysilicon layer so the remaining polysilicon layer only resides in the first and the second trenches; forming a conductive layer on the semiconductor structure; patterning the conductive layer to form a plurality of landing pads on the array region, and a plurality of bit line units on the peripheral region; and forming a plurality of capacitor units which is in electrical connection to the landing pads.

10 Claims, 5 Drawing Sheets

MANUFACTURING METHOD OF RANDOM ACCESS MEMORY

BACKGROUND OF THE INSTANT DISCLOSURE

1. Field of the Instant Disclosure

The instant disclosure relates to a method of manufacturing random access memory; in particular, to an improved method of manufacturing random access memory.

2. Description of Related Art

The relevant systems and devices regarding the semiconductor are improving unceasingly along with the advance of the semiconductor technology, and this has also further enhanced the efficiency of current random access memories. Nevertheless, in order to attain a random access memory with a reduced production cost to be economically advantageous, more methods on improvements of such devices should be provided to increase the competitiveness for the manufactures.

With reference to FIG. 1, conventional semiconductor structures are formed with an array region A and a peripheral region P thereon. However, a particular sequence is required for the formation of the trenches within the aforementioned regions in current manufacturing processes. Specifically speaking, a plurality of trenches will be formed in the array region A prior to a plurality of trenches formed in the peripheral region P, where this has increased an additional step of manufacturing during the process. Furthermore, the capacitor units in conventional manufacturing processes are not arranged to achieve the highest density. Therefore, the amount of capacitor units installed in the semiconductor structure will be restricted. As a consequence, for manufactures pursuing random access memories with a higher efficiency, such manufacturing processes will not be competitive and advantageous.

SUMMARY OF THE INSTANT DISCLOSURE

The object of the instant disclosure is to combine the two processes of forming a plurality of trenches on two regions into one process, by concurrently forming the trenches on an array region and a peripheral region. In addition, the capacitor units are hexagonally arranged to achieve the highest density for the random access memory to attain a higher efficiency.

In order to achieve the aforementioned objects, according to an embodiment of the instant disclosure, a manufacturing method of a random access memory is provided, including the following steps of: providing a semiconductor structure having an array region and a peripheral region formed thereon. Followed on, forming a plurality of first trenches on the array region, and concurrently, forming a plurality of second trenches on the peripheral region. To continue, forming a polysilicon layer on the array region and the peripheral region to fill up the first and the second trenches. Then, planarizing the polysilicon layer so the remaining polysilicon layer only fills up the first and the second trenches. Followed on, forming a conductive layer on the semiconductor structure before patterning the conducting layer to form a plurality of landing pads on the array region and a plurality of bit lines on the peripheral region. Finally, forming a plurality of capacitor units which is in electrical connection to the landing pads.

Based on the above, since the first and the second trenches are formed concurrently in the same procedure, a manufacturing process with a more efficient production can be achieved with a reduced cost. Furthermore, the improved arrangements of the landing pads which are connected to the capacitor units enable the capacitor units to be hexagonally arranged to achieve the highest density. Therefore, the efficiency of the random access memories can be increased significantly.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

A manufacturing method of a random access memory is provided in the instant disclosure, including the following steps as provided.

Figure 1:
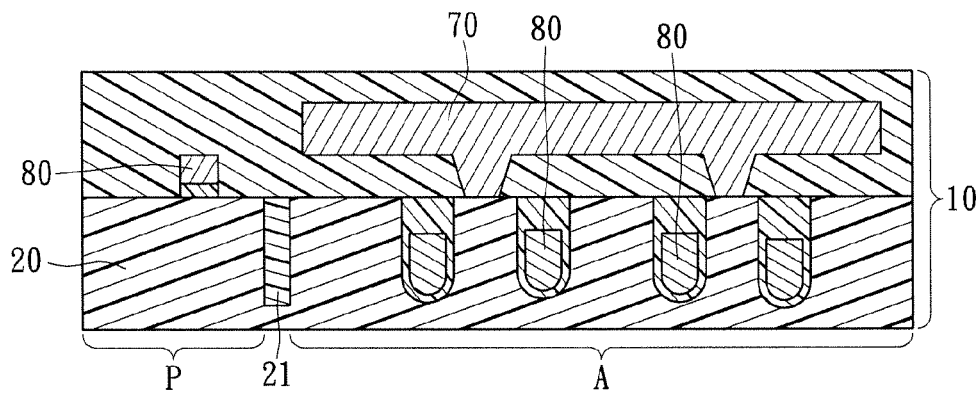
FIG. 1 shows a schematic view of a semiconductor structure of a random access memory according to the instant disclosure.

Firstly, with reference to FIG. 1, providing a semiconductor structure 10 having an array region A and a peripheral region P, where the peripheral region P is arranged on the periphery of the array region A. Furthermore, the array region A and the peripheral region P are divided by an annular trench 21, however, a connection is maintained therebetween through a semiconductor substrate 20. In addition, a plurality of bit line units 70 is formed in the array region A, and a plurality of word line units 80 is formed in the array region A and the peripheral region P.

Figure 2:
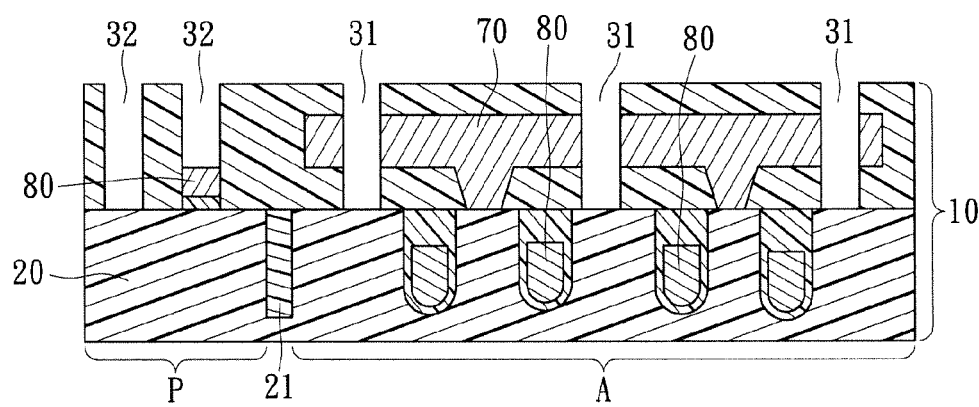
FIG. 2 shows a schematic view of the formation of a plurality of first and second trenches according to the manufacturing method of the random access memories.

With reference to FIG. 2, a plurality of first trenches 31 is formed in the array region A, and concurrently, a plurality of second trenches 32 is formed in the peripheral region P. Specifically speaking, a photoresistance capable of defining the plurality of the first trenches 31 and the plurality of the second trenches 32 can be formed in one performance of the process of lithography. In other words, the patterns on the first and the second trenches 31 and 32 are defined in the same performance of lithography. Followed on, the plurality of first trenches 31 is formed in the array region A, and concurrently, the plurality of the second trenches 32 are formed in the peripheral region P by means of etching. To provide further explanations, the first trenches 31 pass through the bit line units 70 to reach the semiconductor substrate 20, and the base of the first trenches 31 is defined by the top surface of the semiconductor substrate 20. In addition, the base of the second trenches 32 is partially defined by the top surface of the word line units 80 and the top surface of the semiconductor substrate 20.

Figure 3:
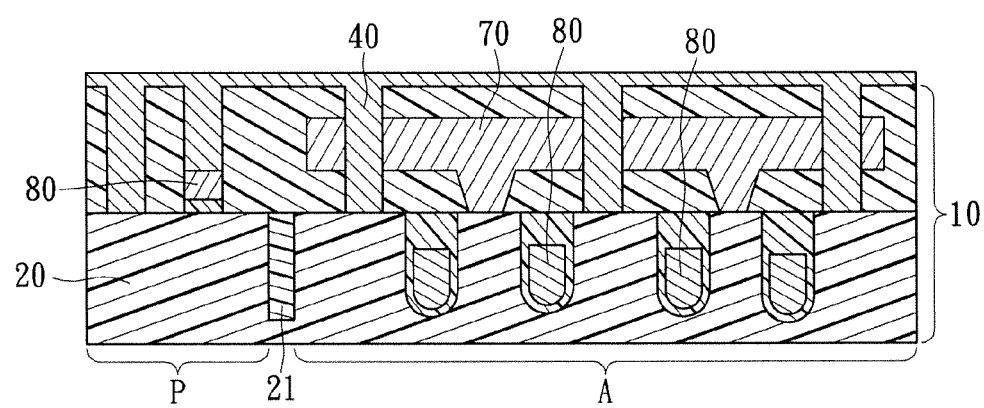
FIG. 3 shows a schematic view of the deposition of a polysilicon layer according to the manufacturing method of the random access memories.
Figure 4:
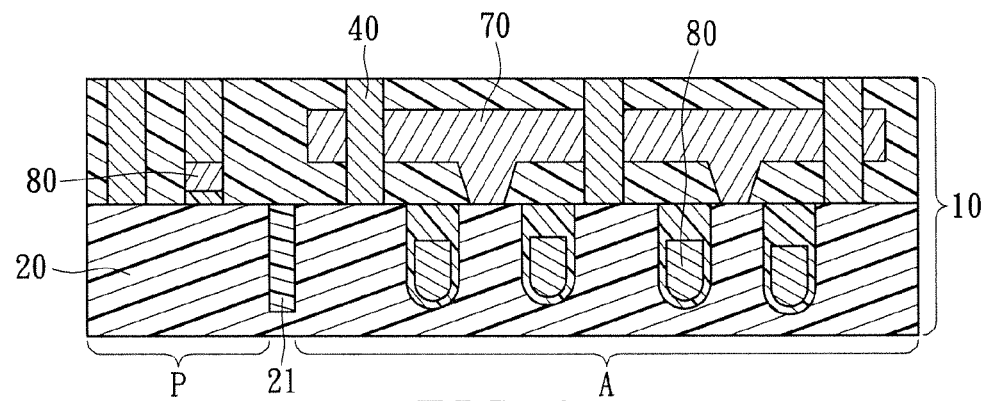
FIG. 4 shows a schematic view of the planarization of the polysilicon layer according to the manufacturing method of the random access memories.

Please refer to FIG. 3, a polysilicon layer 40 is formed by means of deposition, where the polysilicon layer 40 is covered on the array region A and the peripheral region P. Furthermore, the polysilicon layer 40 will fill up the first and the second trenches 31 and 32. Followed on, with reference to FIG. 4, the polysilicon layer 40 is planarized so the remaining polysilicon layer 40 only resides in the first and the second trenches 31 and 32. Specifically speaking, the polysilicon layer 40 is planarized by means of chemical mechanical polishing.

Figure 5:
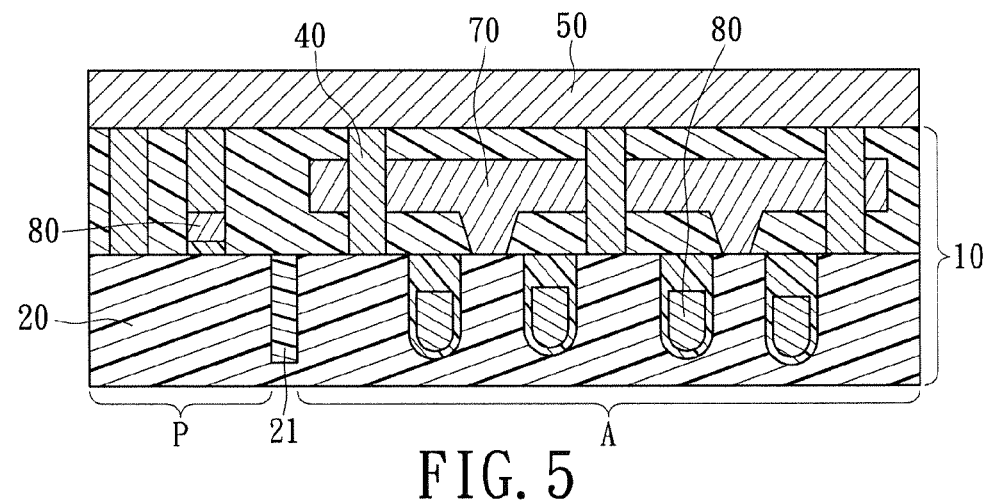
FIG. 5 shows a schematic view of the formation of a conductive layer according to the manufacturing method of the random access memories.
Figure 6:
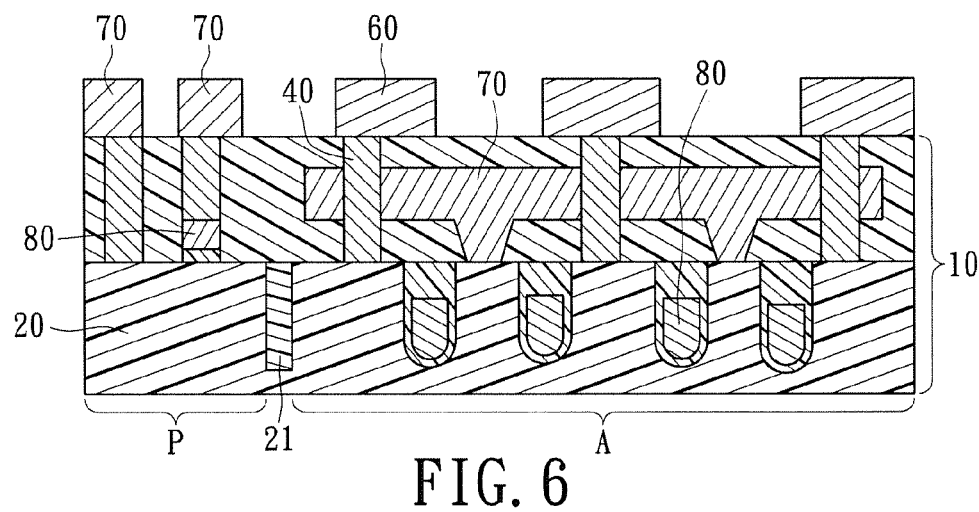
FIG. 6 shows a schematic view of the formation of landing pads and bit line units according to the manufacturing method of the random access memories.

With reference to FIG. 5, a conductive layer 50 is formed on the surface of the semiconductor structure 10. To provide further explanations, the conductive layer 50 can be selected from the group of tungsten (W), titanium (Ti), titanium nitride (TiN), or a combination thereof. The conductive layer 50 can be also formed by the aforementioned materials in a stacked manner, where the material is not restricted thereto. With reference to FIG. 6, the conductive layer 50 is patterned in forming a plurality of landing pads 60 and a plurality of bit line units 70. To provide further explanations, the plurality of landing pads 60 is formed on the array region A, and the plurality of bit line units 70 is formed on the peripheral region P.

Figure 7A:
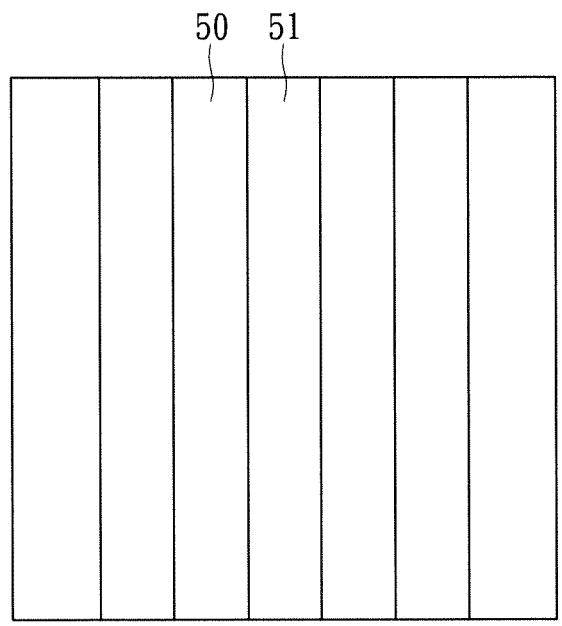
FIG. 7A shows a top view of the first conduction of the lithography process according to the manufacturing method of the random access memories.
Figure 7B:
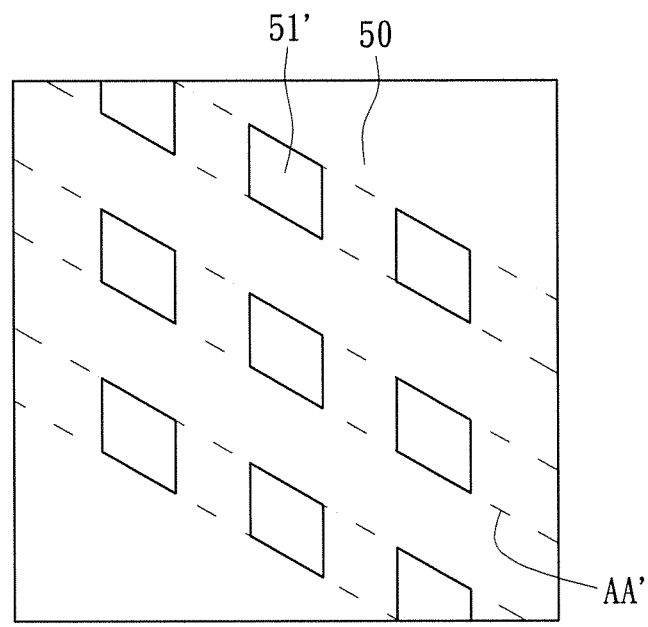
FIG. 7B shows a top view of the second conduction of the lithography process according to the manufacturing method of the random access memories.
Figure 7C:
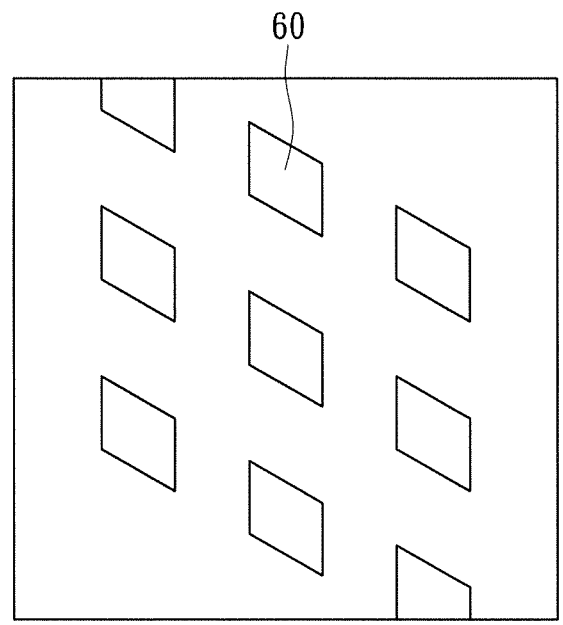
FIG. 7C shows a top view of the formation of the landing pads according to the manufacturing method of the random access memories.

Specifically speaking, with reference to FIG. 7A, the process of lithography is conducted for the first time to form a photoresistance layer 51 having a first pattern on the conductive layer 50. As the first pattern is a linear pattern, therefore, a plurality of linear photoresistance is formed on the conductive layer 50. Followed on, with reference to FIG. 7B, the process of lithography is conducted for the second time to form a photoresistance layer 51' having a second pattern on the conductive layer 50. Since the second process of lithography forms a space in the AA' direction, therefore, among the plurality of the photoresistances, those which are overlapping with the AA' direction will be removed to form island-shaped second patterns. To continue, please refer to FIG. 7C, the conductive layer 50 is patterned by means of etching in forming a plurality of island-shaped landing pads 60. Furthermore, the landing pads 60 are formed in staggered.

Figure 8:
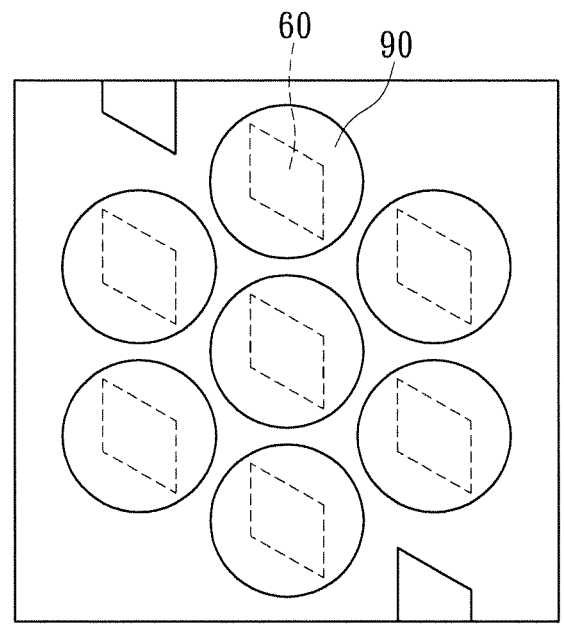
FIG. 8 shows a top view of the formation of the capacitor units according to the manufacturing method of the random access memories.

Please refer to FIG. 8, a plurality of capacitor units 90 is formed, where the capacitor units 90 are connected electrically to the landing pads 60. Furthermore, the staggered of the landing pads 60 enables the capacitor units 90 to be hexagonally arranged to achieve the highest density.

Figure 9:
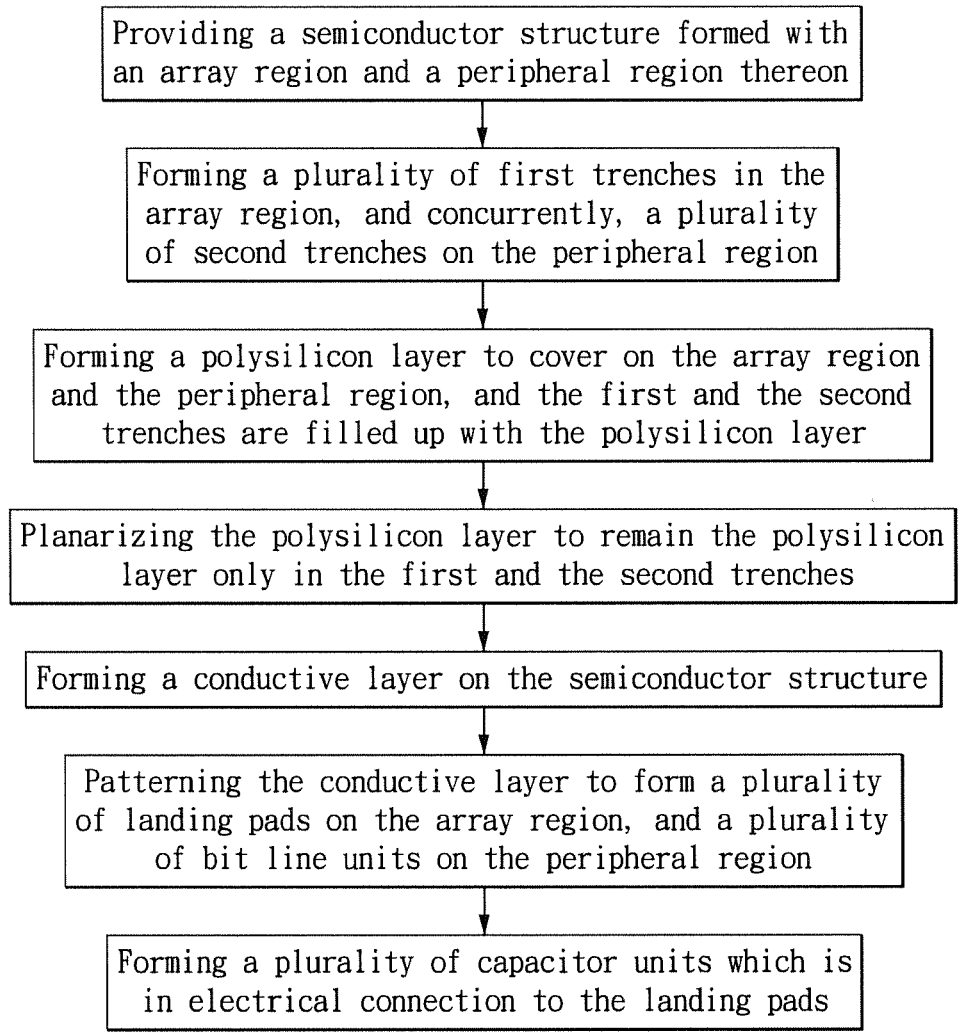
FIG. 9 shows a flow chart of the manufacturing method of the random access memories according to the instant disclosure.

Please refer to FIG. 9, which shows a flow chart of the manufacturing method provided in the instant disclosure. By using this manufacturing method, a random access memory can be provided in the instant disclosure.

Based on the above, as the first and the second trenches are formed in the same manufacturing process of the instant disclosure, the efficiency of production can be increased to save cost. Furthermore, the staggered of the landing pads which are connected to the capacity units enables the capacitor units to be hexagonally arranged to achieve the highest density. Hence, the efficiency of the random access memories can be increased significantly.

The descriptions illustrated supra set forth simply the preferred embodiment of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A manufacturing method of a random access memory, comprising the following steps of:
    providing a semiconductor structure having an array region and a peripheral region;
    forming a plurality of first trenches in the array region, and concurrently, a plurality of second trenches on the peripheral region;
    forming a polysilicon layer to cover on the array region and the peripheral region, and the first and the second trenches are filled up with the polysilicon layer;
    planarizing the polysilicon layer so the remaining polysilicon layer is resided only in the first and the second trenches;
    forming a conductive layer on the semiconductor structure;
    patterning the conductive layer to form a plurality of landing pads on the array region and a plurality of bit line units on the peripheral region; and
    forming a plurality of capacitor units which is in electrical connection to the landing pads;
wherein the first trenches are formed with penetrating through the bit line units.

2. The manufacturing method of the random access memory according to claim 1, wherein the array region and the peripheral region are connected by a semiconductor substrate.

3. The manufacturing method of the random access memory according to claim 2, wherein the base of the first trenches is defined by the top surface of the semiconductor substrate.

4. The manufacturing method of the random access memory according to claim 2, wherein the base of the second trenches is partially defined by the top surface of the semiconductor substrate.

5. The manufacturing method of the random access memory according to claim 1, wherein the planarizing of the polysilicon layer is by performed by means of chemical mechanical polishing.

6. The manufacturing method of the random access memory according to claim 1, wherein the material of the conductive layer is selected from a group consisting of tungsten (W), titanium (Ti), titanium nitride (TiN), and a combination thereof.

7. The manufacturing method of the random access memory according to claim 1, wherein the step of patterning the conductive layer further comprises the steps of:
    performing the process of lithography for the first time to form a photoresistance layer having a first pattern on the conductive layer;
    performing the process of lithography for the second time to form a photoresistance layer having a second pattern on the conductive layer; and
    patterning the conductive layer by means of etching.

8. The manufacturing method of the random access memory according to claim 7, wherein the first pattern is a linear pattern.

9. The manufacturing method of the random access memory according to claim 7, wherein the second pattern is an island-shaped pattern.

10. The manufacturing method of the random access memory according to claim 1, wherein the capacitor units are arranged in a hexagonal configuration.

* * * * *